(12) United States Patent
Fischer

(10) Patent No.: US 9,640,695 B2
(45) Date of Patent: May 2, 2017

(54) SHAFT BEARING FOR SOLAR PANELS AND DRIVE UNIT

(71) Applicant: Werner Fischer, Untergriesbach (DE)

(72) Inventor: Werner Fischer, Untergriesbach (DE)

(*) Notice: Subject to any disclaimer, the term of this patent is extended or adjusted under 35 U.S.C. 154(b) by 206 days.

(21) Appl. No.: 14/334,464

(22) Filed: Jul. 17, 2014

(65) Prior Publication Data

US 2015/0027512 A1    Jan. 29, 2015

(30) Foreign Application Priority Data

Jul. 24, 2013 (AT) .................. GM50104/2013 U

(51) Int. Cl.
*F16M 11/00* (2006.01)
*H01L 31/052* (2014.01)
(Continued)

(52) U.S. Cl.
CPC .......... *H01L 31/0522* (2013.01); *F24J 2/523* (2013.01); *F24J 2/541* (2013.01); *F24J 2002/5437* (2013.01); *Y02E 10/47* (2013.01)

(58) Field of Classification Search
CPC ... F24J 2/54; F24J 2002/5437; H01L 31/0522
See application file for complete search history.

(56) References Cited

U.S. PATENT DOCUMENTS

| 6,058,930 A | 5/2000 | Shingleton |
|---|---|---|
| 7,836,879 B2 | 11/2010 | Mackamul |

(Continued)

FOREIGN PATENT DOCUMENTS

| DE | 20 2009 006 082 U1 | 6/2010 |
|---|---|---|
| DE | 20 2011 101 252 U1 | 8/2011 |

(Continued)

OTHER PUBLICATIONS

Espacenet English language abstract for EP 2249103 A2, published Nov. 10, 2010.

*Primary Examiner* — Amy Sterling
(74) *Attorney, Agent, or Firm* — Tiajoloff & Kelly LLP

(57) ABSTRACT

The present invention relates to a device for the mounting and single-axis solar position tracking of a plurality of tracking units arranged successively in the north-south direction for solar panels having multiple drive units for this solar position tracking, wherein each tracking unit consists of a supporting framework for two adjacent solar panel assemblies each having multiple solar panels, which are installed on panel carriers, each have an associated main support shaft and a drive unit, wherein each main support shaft is connected at the ends to a main support receptacle in each case, the imaginary longitudinal axis through all main support receptacles forms the overall axis of rotation of the device, wherein the overall axis of rotation can have a bend, the drive unit is connected to two directly adjacent main support receptacles, so that a drive unit communicates in each case with two main support shafts, and causes the tracking of both solar panel assemblies from east to west and back by extending or retracting a telescopic arm, wherein each main support shaft is only connected to one drive unit, the entire arrangement is supported by piledriven profiles and each drive unit is connected to a piledriven profile and the mounting plates of the two main support receptacles supported on this piledriven profile.

21 Claims, 8 Drawing Sheets

(51) Int. Cl.
*F24J 2/54* (2006.01)
*F24J 2/52* (2006.01)

(56) References Cited

U.S. PATENT DOCUMENTS

| | | | |
|---|---|---|---|
| 8,203,110 B2 | 6/2012 | Silvestre Mata | |
| 8,453,328 B2 | 6/2013 | Kats et al. | |
| 8,459,249 B2 * | 6/2013 | Corio | F24J 2/5406 126/600 |
| 8,671,930 B2 * | 3/2014 | Liao | F24J 2/5232 126/576 |
| 2006/0044511 A1 | 3/2006 | Mackamul | |
| 2008/0251115 A1 * | 10/2008 | Thompson | F24J 2/541 136/251 |
| 2010/0139647 A1 | 6/2010 | Silvestre Mata | |
| 2011/0289750 A1 | 12/2011 | Kats et al. | |
| 2012/0216852 A1 | 8/2012 | Almy et al. | |

FOREIGN PATENT DOCUMENTS

| | | |
|---|---|---|
| DE | 20 2011 103 199 U1 | 12/2011 |
| EP | 2 123 993 A1 | 11/2009 |
| EP | 2249103 A2 | 11/2010 |
| WO | 2006/020597 A1 | 2/2006 |

* cited by examiner

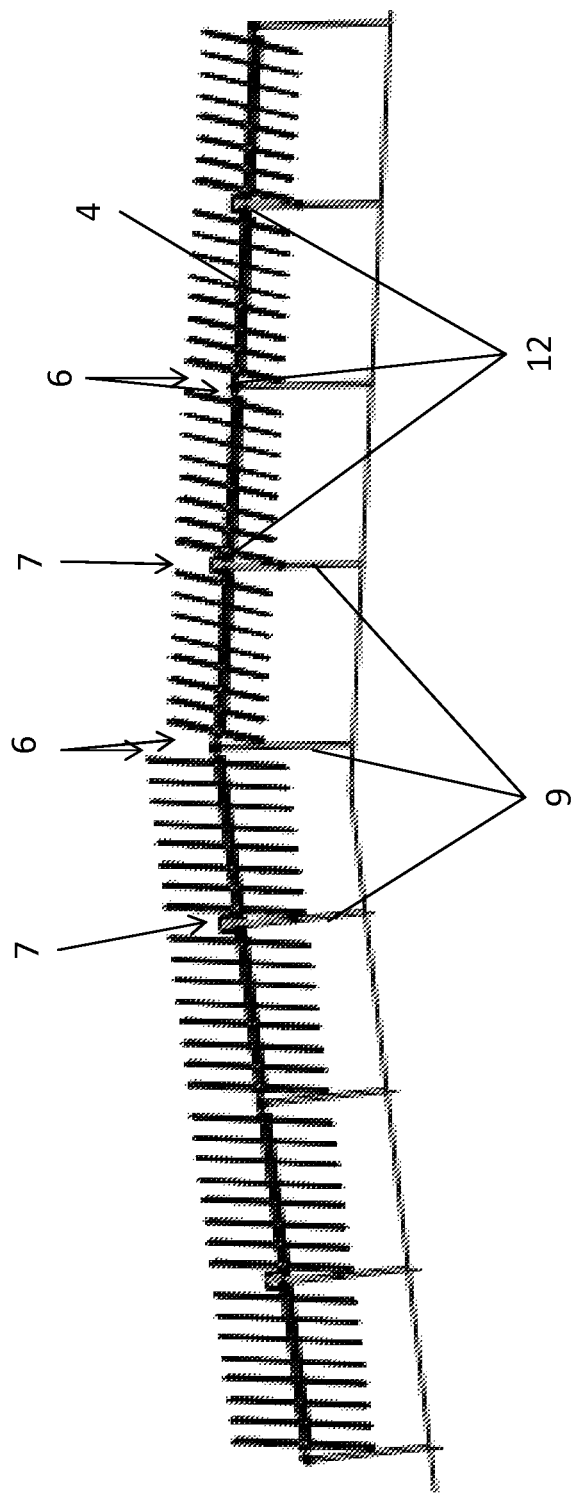

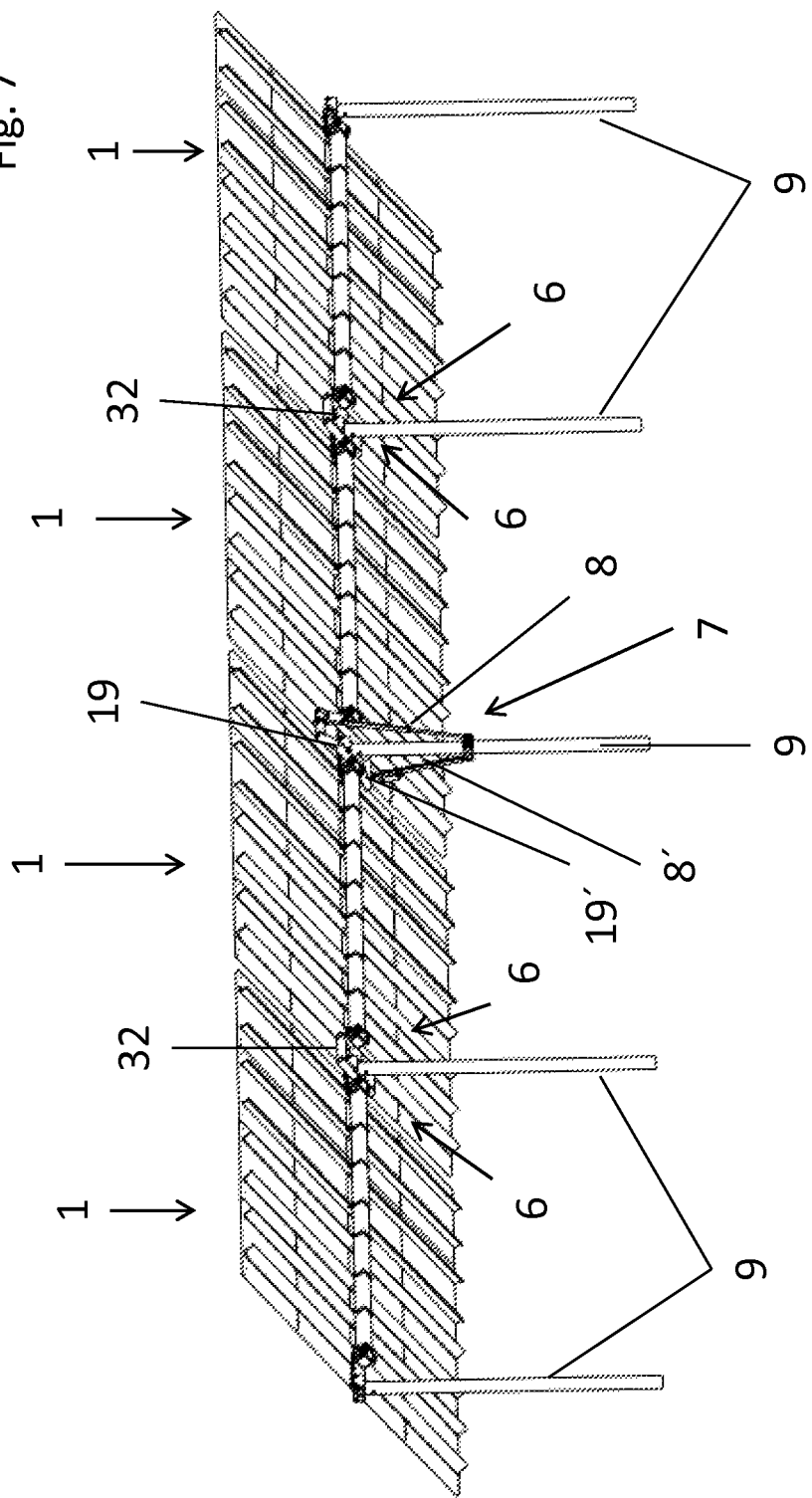

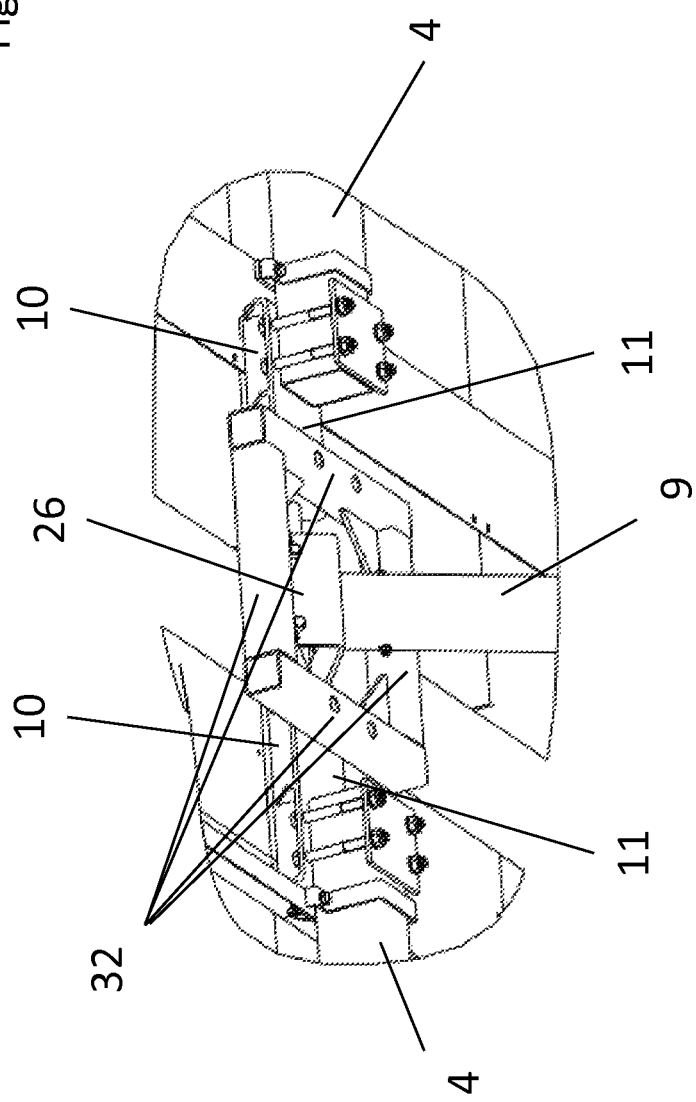

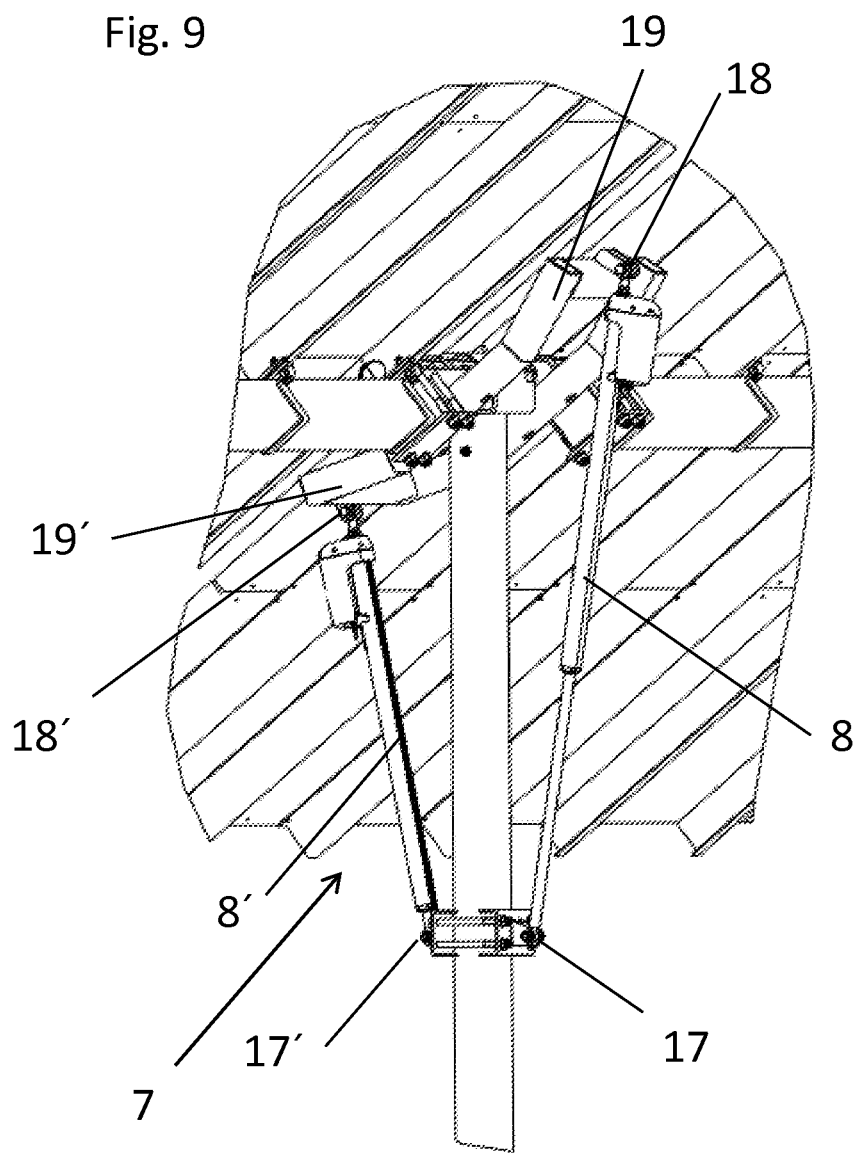

SHAFT BEARING FOR SOLAR PANELS AND DRIVE UNIT

TECHNICAL AREA

The present invention relates to a shaft bearing for the single-axis solar position tracking of a plurality of solar panel assemblies and a drive unit for this solar position tracking.

Solar position tracking apparatuses for energy conversion modules have been known for some time. Thus, the German utility model application DE 20 2009 006 082 describes a system of the type according to the species, wherein a plurality of tracking units have at least one coupling rod and at least one drive unit, wherein each tracking unit comprises a supporting framework for accommodating at least one energy converter and two support elements, which are spaced apart from one another, and between which the supporting framework is mounted so it is rotatable around an axis of rotation. Via a movement of the coupling rod transversely to the pivot axes of the supporting frameworks, these are pivotable jointly. Similar apparatuses are also disclosed in WO 2006/020597 and U.S. Pat. No. 6,058,930. The goal of DE 20 2009 006 082 in relation to the last-mentioned publications is to provide a simpler construction of the energy conversion plants having multiple energy conversion modules and multiple tracking units. This is achieved by implementing the support elements as piledriven profiles, which are suitable for setup in uneven terrain, to allow the desired north-south inclination of the plant. However, the achievement of the object according to DE 20 2009 006 082 has the disadvantage that the mounting of the rotating shaft is rigid, i.e., the rotating shaft itself must be implemented absolutely linearly along the north-south inclination.

A further system of the type according to the species is disclosed by DE 20 2011 101 252. In this device for assembling a terrestrial solar photovoltaic tracking assembly, the torque pipe consists of multiple torque pipes installed successively on vertical supporting members. The goal of this invention is to allow the assembly of the plant on location by unskilled workers. However, this system has the disadvantage of the mounting of the individual sections of the torque pipe, which are attached to one another in a co-linear manner with end-on-end orientation on spaced-apart vertical girders, since it also provides a completely linear course of the individual sections of the torque pipe, bending of the axis of rotation of the torque pipe vertically to the axis of rotation, which has heretofore been necessary in the case of uneven terrain to avoid more extensive excavation work to prepare the setup supporting surface, is not possible in the system according to DE 20 2011 101 252.

Furthermore, numerous drive units for rotating a linear support shaft to mount a plurality of solar panels or solar panel field mounts are known from the prior art, reference is made as examples to DE 20 2011 103 199, EP 2 123 993 A1, and US 2012/0216852 A1, which can exclusively be used in the case of flat setup locations, however.

In the shaft bearings according to the species for solar panels and drive units according to EP 2 123 933 A1, adjacent main support shafts 3 are connected by intermediate axles 4, wherein the connection of the intermediate axle 4 to adjacent main support shafts 3 is rigid and does not allow a degree of freedom in relation to slight angle deviations in the event of uneven terrain profile.

The use of piledriven profiles as support elements has proven to be very advantageous economically, since it is possible here to substantially maintain the topsoil in its original form, which has great significance for the overall static equilibrium of the device. A typical terrain profile does not correspond to this ideal case of absolutely level topsoil, however. Irregularities are usually present, which are to be taken into consideration in particular during the installation of the piledriven profiles, i.e., the installation of the piledriven profiles proves to be very time-consuming. In spite of all care, it is hardly possible to align all support surfaces of a continuous axis of rotation 100% level with one another, however.

The present invention therefore has the object, in the case of a drive unit, which is supported on a piledriven profile and engages using its drive rod directly on the axis of rotation, similarly to the drive unit which is disclosed in EP 2 123 993 A1, of allowing an optimal load profile during the pivot movement.

This object is achieved according to the invention in that the main support shaft, which bears the support elements of a plurality of solar panels, respectively lies at its ends in a main supporting receptacle and the main supporting receptacle lies by means of bolts in a bearing shaft carrier, wherein the supporting shaft of the bearing shaft carrier is inserted into the upper end of the piledriven profile and the drive unit, which is fastened on the shaft of the piledriven profile, engages on the mounting plate of the rotating shaft. The main support receptacle consists of a rotating shaft, a bolt plate at one end of the rotating shaft, in which the rotating shaft can rotate unobstructed, and a mounting plate having permanently installed rotating shaft bearing profiles, a counter plate, and fastening bolts, using which the counter plate is connected to the mounting plate. The main support shaft lies between the mounting plate and the counter plate and is fixed in a clamping manner via the fastening bolts between the mounting plate and the counter plate, for example. The mounting of the main support receptacle therefore consists of a rotating suspension which accommodates rotating and tilting movements. The rotating shaft is either bearing-free or is alternatively equipped with bushings or other bearings.

In contrast to the drive unit according to the species mentioned at the outset, the unit according to the invention is capable of maintaining an optimal load profile during a pivot movement, in that adjacent axes of rotation of a multipart overall axis of rotation can optionally be set bent—i.e., at an inclined angle to one another.

The axis of rotation is therefore implemented in multiple parts and can optionally extend in bent form in the longitudinal axis corresponding to the terrain profile. In this case, adjacent axis of rotation sections, which rest on a shared piledriven profile, can have a nonlinear course to a limited extent, to be able to arrange the overall plant according to the terrain profile in the event of terrain irregularities. This is to prevent the topsoil from being stressed by extensive excavation work, which could negatively influence the static equilibrium of the overall plant.

The basic concept for achieving this object is the connection of a hollow shaft to a baseplate, which is used for the clamping or screw connection of a carrier shaft. Alternatively, a solid shaft having any common profile is also to be usable, whether it is a round pipe, oval pipe, rectangular pipe, triangular pipe, H-bar (steel), T-bar, angle iron, or other profiles.

Preformed flat iron bars having laterally attached bolts, balls with bolts or without bolts in prefinished bearings can be used here. Avoiding shifts can occur by means of attached limiting rings, cotter pins, lock pins, notched guiding iron bars, or stops.

The rotating shaft is fastened on a mounting plate and is connected to the baseplate using statically required reinforcements so that the torsion forces for guiding the driven shaft can be absorbed without twisting the rotating shaft. The mounting plate is ideally manufactured from one piece, but can also be connected in single pieces to the rotating shaft.

A part of the mounting plate is used by means of the counter plate for the dimensionally-stable clamping of the main support shaft to the driven main support receptacle. A part of the mounting plate or the separately attached part of the mounting plate is used to fasten the drive bracket. The fastening of the drive bracket can be performed by means of a screw connection or also by plugging into prefinished plug-in sleeves. In the case of a screwed-on embodiment, pre-drilled enclosed plates, enclosed discs, or fundamentally thicker wall thicknesses of the drive bracket are used depending on the static equilibrium requirement.

The drive bracket, which closely connects two main support receptacles to one another, so that two shafts can be driven simultaneously and in the same direction, is embodied as a rectangular pipe, or alternatively as a round pipe, oval pipe, triangular profile, T-bar, H-bar, or U-bar. The shape of the drive bracket is optionally rectangular, angled, rounded, welded, or curved.

Multiple shafts can also be driven in succession using the above-described drive brackets. Reference is expressly made to the possibility that these brackets can also be attached on both sides of the columns, so that more than two shafts can also be connected to one another and driven via higher stability of the screw connection and the use of suitable motors. Linear motors, hydraulic drives, cable pulls, chain drives, or pushrods are used as drive units.

The bolt plate lies with a narrow side in the bearing shaft carrier in such a manner that the laterally protruding bolts protrude through two opposing U-shaped recesses in the side wall of the bearing shaft carrier. An attached comb plate holds the bolts in the U-shaped recesses and prevents them from escaping upward as soon as the rotating shaft is rotated. The bolts have a small amount of play in the U-shaped recesses of the side walls of the bearing shaft carrier. The parts of the bolt plate protruding vertically from the rotating shaft are embodied at different heights in a preferred embodiment, whereby better adaptation of the vertical location of the rotating shaft to achieve the desired inclination of the main support shaft for adaptation to an uneven terrain profile is possible.

A linear drive is fastened on the shaft of the piledriven profile. The mounting plate of the linear drive has permanently installed profiles on one side, which partially enclose the contour of the piledriven profile, and permanently installed jaws on the opposite side, between which the lower eye of the linear drive is mounted.

The upper eye of the linear drive is connected to a drive bracket. The drive bracket consists, for example, of three, preferably five sections which are permanently connected to one another, and which jointly describe a U-profile, wherein the jaws on which the upper eye of the linear drive is fastened are located on the connecting arm. The terminal sections of the drive bracket are connected to the mounting plate. This embodiment is maintained in the further description and in the figures for illustrating the invention. However, it is apparent that the drive bracket can also be a bent part made of a pipe of arbitrary cross section. Any other shape of the drive bracket which allows the described rotating operation in the desired manner also falls under the present invention.

In a preferred embodiment of the drive bracket, which is composed of five sections, the terminal sections are at an angle to the plane of the drive bracket. It has proven to be particularly advantageous in this case to dimension this angle to be approximately 15°. Furthermore, it has proven to be particularly advantageous to select the dimensioning of the individual components of the drive unit so that the telescopic arm of the linear drive assumes an angle to the axis of the piledriven profile of approximately 8° both in the retracted state and also in the extended state, since the drive motor requires the smallest force for the approach in every position of the panel field here. The drive point therefore lies directly on the shaft, whereby a substantially equal static curve is achieved and the inclination of the panels is equal on both sides in the respective final position.

Using the drive bracket according to the invention, it is possible to move two adjacent panel fields using only one drive unit, wherein the bending load of the piledriven profile is minimal, in particular with the preferred embodiment of the drive unit, since the main portion of the load action is dissipated perpendicularly into the topsoil and only a slight horizontal load action is exerted on the piledriven post.

If an uneven terrain profile exists, for example, a hillside location which requires a bend in the course of the axes of two adjacent main support shafts, the drive unit is fastened on adjacent main support receptacles, the longitudinal axes of which extend linearly, and the main support receptacle of two main support shafts, whose axes have a bend to one another, is arranged shifted by the length of the main support shaft for this purpose, for example.

By way of the embodiment according to the invention of the shaft bearings of multiple adjacent main support shafts on a plurality of piledriven profiles, which are arranged spaced apart from one another, and the drive unit according to the invention, it is possible to apply an alignment of multiple panel fields located adjacent to one another also over multiple terrain irregularities, wherein larger terrain steps also no longer represent a problem, in contrast to conventional plants, which require a linear course of the axis of rotation of the panel fields, as is known from the prior art.

The invention will be explained in greater detail hereafter on the basis of the figures. In the figures:

FIG. 6 shows a schematic illustration of the profile of the axis of rotation of multiple panel fields without solar panels over an uneven terrain;

FIG. 7 shows a perspective view of an alternative embodiment of the plant according to the invention;

FIG. 8 shows a FIG. 7 with a rotationally-fixed connection of adjacent panel fields;

FIG. 9 shows a further detail view from FIG. 7 with an advantageous variant of the drive unit.

Figure 1:
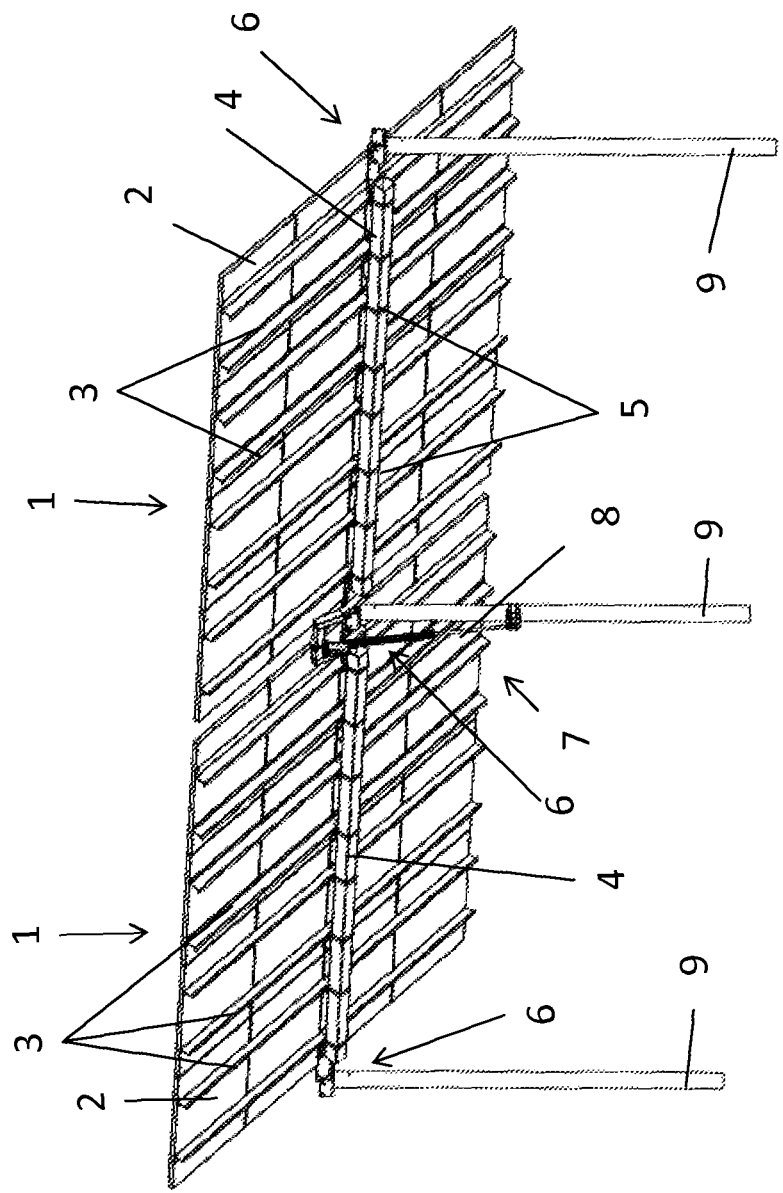
FIG. 1 shows a perspective view having a detail of a plant according to the invention, for example, for obtaining solar power.

FIG. 1 shows an example of the supporting framework for two solar panel assemblies 1 arranged adjacent to one another, each having sixteen solar panels 2, which are installed on panel carriers 3. The panel carriers 3 of each solar panel assembly 1 are connected to the associated main support shaft 4 by means of mounting brackets 5. The main support shafts 4 are connected at the ends to main support receptacles 6. A drive unit 7 is coupled to the two metal main support receptacles 6 and causes, by extending or retracting the telescopic arm 8, the tracking of the two solar panel assemblies 1 from east to west, in order to track the solar panels 1 to the solar position. The entire arrangement is supported by piledriven profiles 9.

Figure 2:
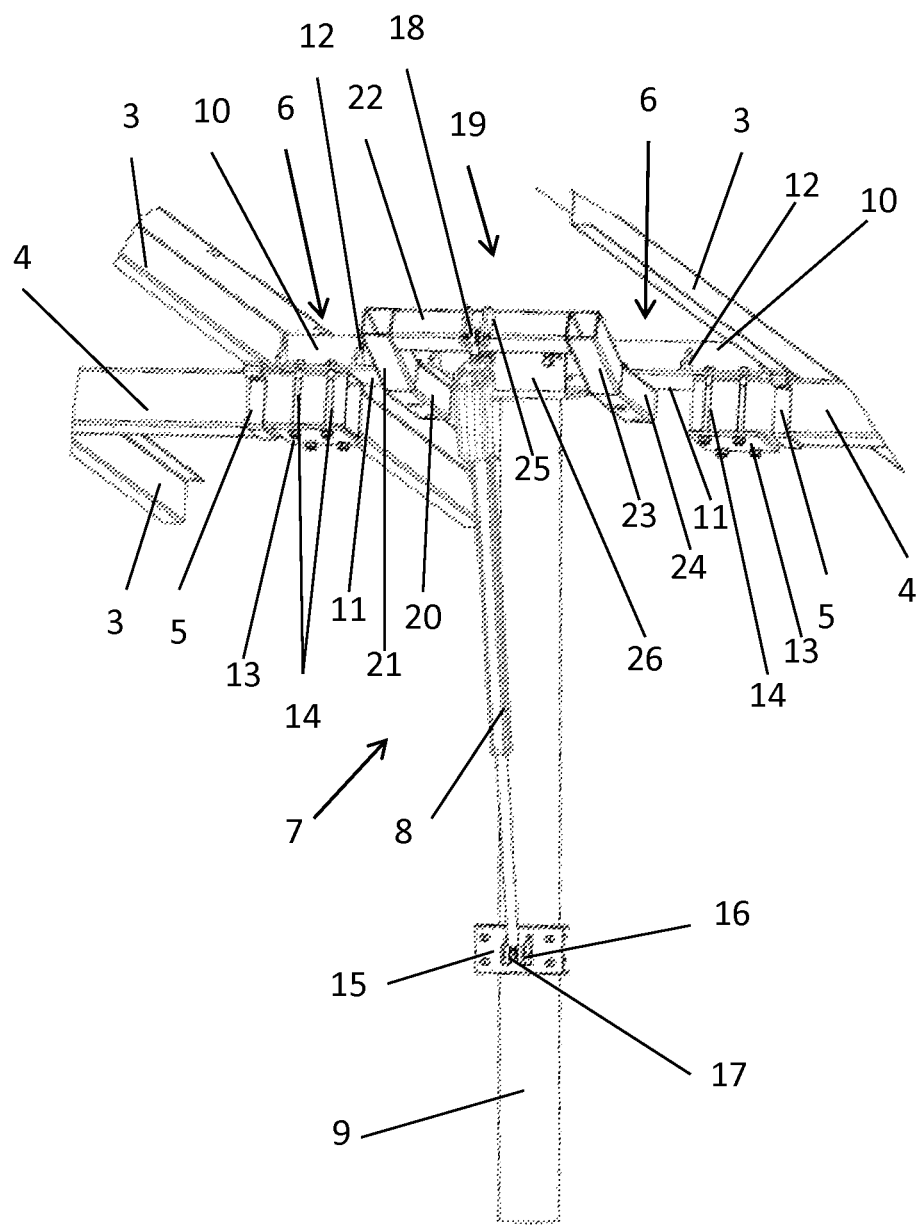
FIG. 2 shows a detail view from FIG. 1 having enlarged illustration of the drive unit for pivoting the panel fields from east to west and vice versa.

The detail view of FIG. 2 illustrates the connection of the two main support shafts 4 to the terminal main support receptacles 6 and the drive unit 7. The main support receptacle 6 consists of a rotating shaft 10, a mounting plate 11 at one end of the rotating shaft 10 having permanently installed rotating shaft 10 bearing profiles 12, in which the rotating shaft 10 can rotate unobstructed, and a counter plate 13 and fastening bolts 14, using which the counter plate 13 is connected to the mounting plate 11. The main support shaft 4 lies between the mounting plate 11 and the counter plate 13 and is fixed in a clamping manner between the mounting plate 11 and the counter plate 13 via the fastening bolts 14.

The drive unit 7 in the form of a linear drive is fastened on the shaft of the piledriven profile 9 and engages on the mounting plate 11 of the rotating shaft 10. The mounting plate 15 of the linear drive has, on one side, permanently installed profiles, which partially encloses the contour of the piledriven profile, or brackets which enclose the shaft of the piledriven profile 9, and, on the opposite side, permanently installed jaws 16 between which the lower eye 17 of the linear drive is mounted. The upper eye 18 of the linear drive is connected to a drive bracket 19. The drive bracket 19 consists of at least three, preferably five sections 20 to 24, which are permanently connected to one another, and which jointly describe a U-profile, wherein the jaws 25, on which the upper eye 18 of the linear drive is fastened, are located on the connecting arm 22. The terminal sections 20, 24 of the drive bracket 19 are connected to the mounting plate 11 of the rotating shaft 10.

Figure 3:
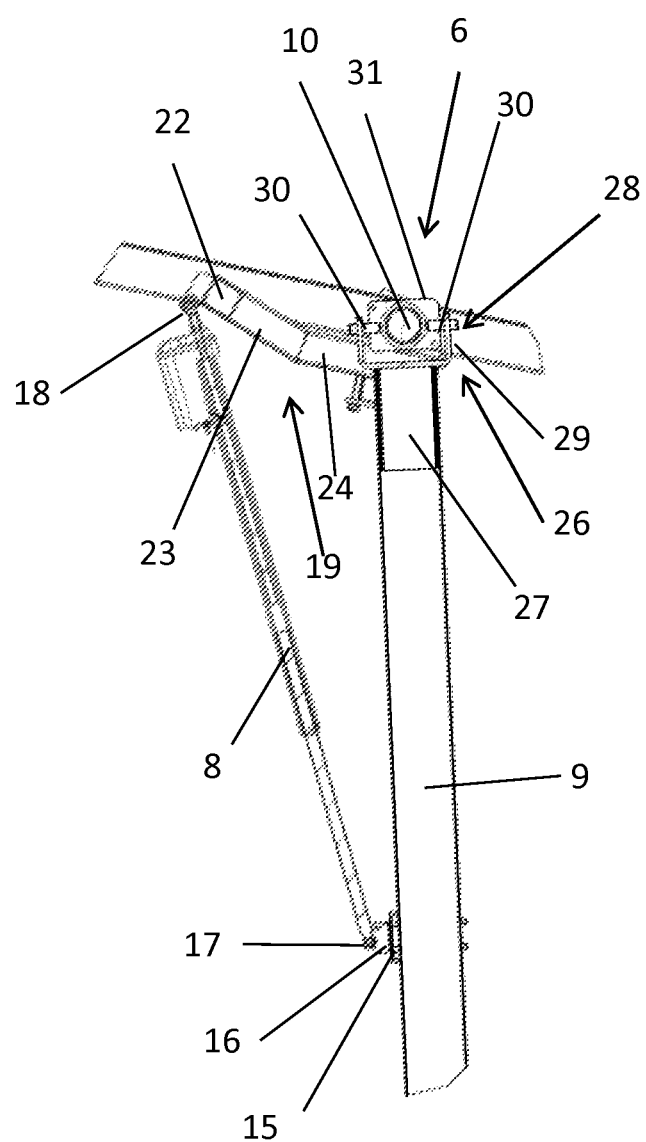
FIG. 3 shows a side view of a vertical section through the illustration of FIG. 2.
Figure 4:
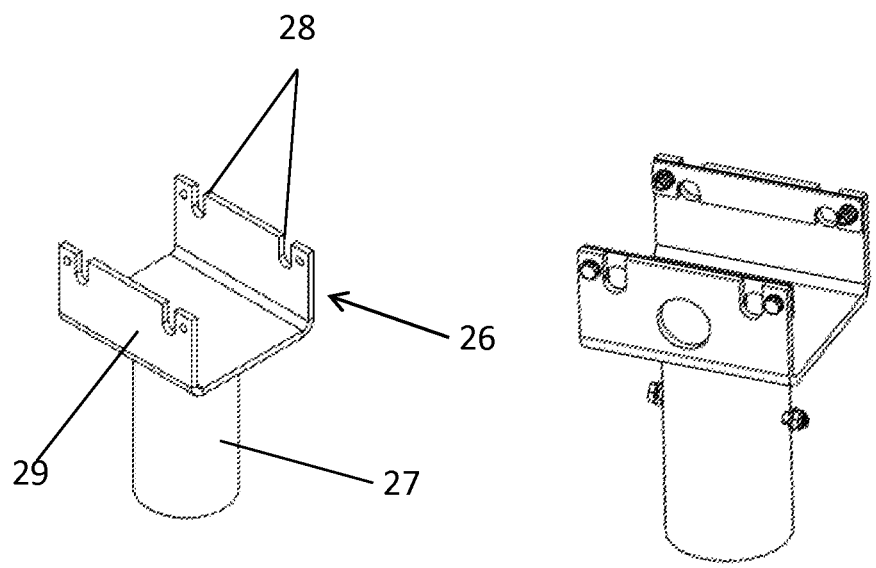
FIG. 4 shows the detail view of a bearing shaft support for accommodating one end of a main support receptacle according to FIGS. 1 and 2.

As shown in FIG. 3, the main support receptacle 6 is located by means of bolts 30 in a bearing shaft carrier 26, wherein the supporting shaft 27 of the bearing shaft carrier 26 is inserted into the upper end of the piledriven profile 9. FIG. 4 shows the bearing shaft carrier 26 once again separately in a perspective view for better understanding.

A narrow side of the mounting plate 31 is located in the bearing shaft carrier 26 such that the laterally protruding bolts 30 protrude through two opposing U-shaped recesses 28 in the side wall 29 of the bearing shaft carrier 26. An attached comb plate (not shown here) holds the bolts 30 in the U-shaped recesses 28 and prevents them from escaping upward, as soon as the rotating shaft 10 is rotated. The bolts 30 have a slight play in the U-shaped recesses 28 of the side walls 29 of the bearing shaft carrier 26. The parts of the mounting plate 31 protruding vertically from the rotating shaft 10 are embodied at different heights in a preferred embodiment, whereby a better adaptation of the vertical location of the rotating shaft 10 to achieve the desired inclination of the main support shaft 4 in adaptation to the terrain profile is made possible.

In the preferred embodiment of the drive bracket 19 shown in FIG. 2, which is composed here of five sections 20 to 24—of which only the sections 22 to 24 are recognizable here—the terminal sections 20 and 24, of which only the section 24 is recognizable here, is at an angle to the plane of the drive bracket 19. In a preferred embodiment, this angle is approximately 15°.

Figure 5:
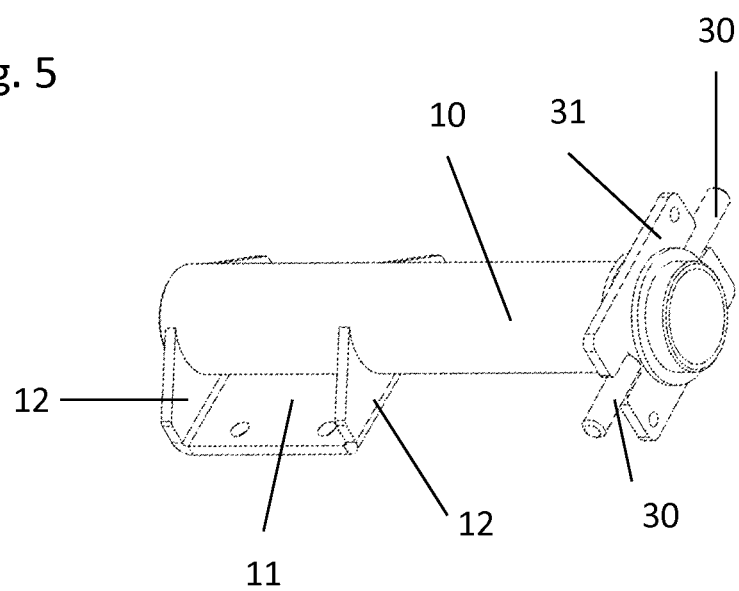
FIG. 5 shows the detail view of a main support receptacle according to FIGS. 1 to 3.

FIG. 5 shows the most important components of the main support receptacle 6 once again separately in a perspective view for better understanding. The rotating shaft 10 is located at the end in the mounting plate 31 and is not linearly displaceable therein, but is mounted so it is rotatable. The bolts 30 protrude laterally from the mounting plate 31. The opposing section of the rotating shaft 10 is located in the rotating shaft bearing profiles 12 of the mounting plate 11, wherein only one or more than two rotating shaft bearing profiles 12 can also be provided. The counter plate 13, which is connected via a fastening bolt 14 to the mounting plate 11 for the clamping fastening of the main support shaft 4, is not shown here.

If an uneven terrain profile is present, for example, a hillside location which requires a bend in the course of the axes of two adjacent main support shafts 4, the drive unit 7 is thus fastened on the mounting plates 11 of adjacent main support receptacles 6, the longitudinal axes of which extend approximately linearly, and the two main support receptacles 6 of two main support shafts 4, the axes of which have a bend to one another, is arranged displaced by approximately the length of the main support shaft 4 for this purpose. This circumstance is schematically shown in FIG. 6.

In a preferred embodiment of the invention, a tracking unit, which is tracked to the solar position by a drive motor, is composed of more than two supporting frameworks for solar panel assemblies 1. This variant is shown in FIG. 7. As an example, a total of four solar panel assemblies 1 are moved by a drive unit 7 having one motor here. Depending on the local conditions, however, fewer or more solar panel assemblies 1 can also be moved by only one drive unit 7. For this purpose, the adjacent main support receptacles 6, which are not connected via a shared drive bracket 19, are connected to one another in a rotationally-fixed manner via a mounting frame 32.

FIG. 8 shows this rotationally-fixed connection as an enlarged detail from FIG. 7 for better clarification. The two main support shafts 4 are permanently connected at the ends to the mounting plates 11. The rotating shafts 10 are mounted at the ends via the bolts 30 in the bearing shaft carrier 26, which is supported in the piledriven profile 9. The rigid mounting frame 32 is screwed onto the two adjacent mounting plates 11 and thus forms a rotationally-fixed connection of these mounting plates 11.

It has proven to be particularly advantageous, also in regard to the embodiment of the invention according to FIG. 7, to implement the drive unit 7 as a double drive having two telescopic arms 8, 8'. This variant is illustrated in FIG. 9 as an enlarged detail from FIG. 7.

The drive unit 7 in the form of a double linear drive has two telescopic arms 8 and 8', which are movable in opposite directions via a shared motor (not shown here), and which engage with their respective upper eye 18, 18' on the drive brackets 19, 19'. The respective lower eyes 17, 17' engages on permanently installed jaws of a shared mount, which permanently encloses the shaft of the piledriven profile 9. This advantageous embodiment of the drive unit 7 allows a uniform force profile over the entire tracking movement and thus avoids unfavorable static force profiles.

The essential advantage of the invention in comparison to the prior art is that by way of the embodiment according to the invention of shaft bearings of multiple adjacent main support shafts 4 on a plurality of piledriven profiles 9, which are arranged spaced apart from one another, and the drive unit 7 according to the invention, it is made possible for the first time to apply an orientation of multiple adjacent solar panel assemblies 1 also over multiple terrain irregularities, wherein larger terrain steps also no longer represent a problem, in contrast to conventional plants, which require a linear course of the axis of rotation of the solar panel assemblies, as are known from the prior art. The essence of the present invention is therefore that angle deviations between the individual longitudinal axes are also tolerable to a certain extent, a circumstance which was heretofore not taken into consideration in the prior art, but is frequently to be encountered in practice due to an irregular terrain profile, and has resulted in premature wear in devices according to the prior art due to an unconsidered torsion forces on the supporting structure and/or an overload of the drive unit.

What is claimed is:

1. A device comprising:

multiple successively arranged tracking units for solar panels each having respective drive units for solar position tracking, wherein each tracking unit has a supporting framework for two adjacent solar panel assemblies each having multiple solar panels, wherein each solar panel assembly has an associated main support shaft, wherein each main support shaft has two ends, and is connected at each end to a respective main support receptacle, wherein the main support shafts and main support receptacles arranged in series form an axis of rotation of the tracking unit, wherein the drive unit of each tracking unit is coupled to two of the main support receptacles directly adjacent thereto such that said drive unit communicates with the main support shafts connected with the main support receptacles adjacent thereto, and causes the tracking of both solar panel assemblies from east to west by extending or retracting a telescopic arm, wherein said adjacent main support receptacles are supported on a shared piledriven profile, and the drive unit is connected to the piledriven profile and to the two main support receptacles, and wherein two of the main support receptacles that are adjacent each other are provided with bolts that are mounted with play in recesses of opposing side walls of a bearing shaft carrier connected to another piledriven profile such that each of the main support receptacles can be moved into inclination to the axis of rotation of the other of the main support receptacles, wherein at least one of the main support receptacles has a rotating shaft, a bolt plate with the bolts at one end of the rotating shaft, a mounting part that is a mounting plate, rotating shaft bearing profiles, a counter plate, and fastening bolts, wherein the main support shaft is located between the mounting plate and the counter plate and is fixed in a clamping manner via the fastening bolts between the mounting plate and the counter plate, wherein the drive unit is a linear drive, and wherein an upper eye of the linear drive is connected to a drive bracket, the drive bracket consisting of at least three sections connected to one another, and that jointly describe a U-profile, and wherein a plurality of jaws, on which the upper eye of the linear drive is fastened, are located on the connecting arm, and the terminal sections of the drive bracket are connected to the mounting plate of the rotating shaft.

2. A device comprising:

multiple successively arranged tracking units for solar panels each having respective drive units for solar position tracking, wherein each tracking unit has a supporting framework for two adjacent solar panel assemblies each having multiple solar panels, wherein each solar panel assembly has an associated main support shaft, wherein each main support shaft has two ends, and is connected at each end to a respective main support receptacle, wherein the main support shafts and main support receptacles arranged in series form an axis of rotation of the tracking unit, wherein the drive unit of each tracking unit is coupled to two of the main support receptacles directly adjacent thereto such that said drive unit communicates with the main support shafts connected with the main support receptacles adjacent thereto, and causes the tracking of both solar panel assemblies from east to west by extending or retracting a telescopic arm, wherein said adjacent main support receptacles are supported on a shared piledriven profile, and the drive unit is connected to the piledriven profile and to the two main support receptacles, wherein two of the main support receptacles that are adjacent each other are provided with bolts that are mounted with play in recesses of opposing side walls of a bearing shaft carrier connected to another piledriven profile such that each of the main support receptacles can be moved into inclination to the axis of rotation of the other of the main support receptacles, wherein at least one of the main support receptacles has a rotating shaft, a bolt plate with the bolts at one end of the rotating shaft, a mounting part that is a mounting plate, rotating shaft bearing profiles, a counter plate, and fastening bolts, wherein the main support shaft is located between the mounting plate and the counter plate and is fixed in a clamping manner via the fastening bolts between the mounting plate and the counter plate, wherein at least two of the main support receptacles have a respective mounting plate, and wherein the drive unit is a linear drive, and is fastened on a shaft of the piledriven profile and engages via a U-shaped drive bracket on the mounting plates of the rotating shafts of two adjacent main support receptacles, and wherein a mounting plate of the linear drive has permanently installed profiles on a first side that partially enclose a contour of the piledriven profile, and jaws on a second side opposite the first side, and between the jaws a lower eye of the linear drive is mounted.

3. The device according to claim 1, wherein the drive bracket is composed of five sections, and wherein terminal sections and are at an angle to a plane of the drive bracket.

4. The device according to claim 3, wherein the angle between the terminal sections and the plane of the drive bracket is approximately 15°.

5. A device comprising:

multiple successively arranged tracking units for solar panels each having respective drive units for solar position tracking, wherein each tracking unit has a supporting framework for two adjacent solar panel assemblies each having multiple solar panels, wherein each solar panel assembly has an associated main support shaft, wherein each main support shaft has two ends, and is connected at each end to a respective main support receptacle, wherein the main support shafts and main support receptacles arranged in series form an axis of rotation of the tracking unit, wherein the drive unit of each tracking unit is coupled to two of the main support receptacles directly adjacent thereto such that said drive unit communicates with the main support shafts connected with the main support receptacles adjacent thereto, and causes the tracking of both solar panel assemblies from east to west by extending or retracting a telescopic arm, wherein said adjacent main support receptacles are supported on a shared piledriven profile, and the drive unit is connected to the piledriven profile and to the two main support receptacles, and wherein two of the main support receptacles that are adjacent each other are provided with bolts that are mounted with play in recesses of opposing side walls of a bearing shaft carrier connected to another piledriven profile such that each of the main support receptacles can be moved into inclination to the axis of rotation of the other of the main support receptacles, wherein the drive unit is only fastened on adjacent mounting plates of adjacent main support receptacles, the support receptacles having longitudinal axes that extend approximately linearly, and wherein the adjacent mounting plates are on main support receptacles of two main support shafts that have axes of that have a bend to one another, and the adjacent mounting plates do not have a connection to a drive bracket of a one of the drive units.

6. The device according to claim 5, wherein at least one of the main support receptacles has a rotating shaft, a bolt plate with the bolts at one end of the rotating shaft, a mounting part that is a mounting plate, rotating shaft bearing profiles, a counter plate, and fastening bolts, wherein the main support shaft is located between the mounting plate and the counter plate and is fixed in a clamping manner via the fastening bolts between the mounting plate and the counter plate.

7. The device according to claim 6, wherein the rotating shaft rests at the end on a bolt plate provided with the bolts and is mounted therein such that said rotating shaft is not linearly displaceable, but is rotatable.

8. The device according to claim 7, wherein the bolts protrude laterally from the bolt plate.

9. The device according to claim 7, wherein the bearing shaft carrier has a U-profile for accommodating the bolt plate, said U-profile having legs formed by opposing side walls, said side walls having U-shaped recesses opposite one another, and wherein the bolt plate is located upright within the U-profile such that the bolts protrude through the U-shaped recesses.

10. The device according to claim 7, wherein the bolt plate is replaceable.

11. The device according claim 6, wherein at least two of the main support receptacles have a respective mounting plate, and wherein the drive unit is a linear drive, and is fastened on a shaft of the piledriven profile and engages via a U-shaped drive bracket on the mounting plates of the rotating shafts of two adjacent main support receptacles.

12. The device according to claim 6, wherein the drive unit drives more than two support shafts via a separate bracket connection.

13. The device according to claim 5, wherein the bearing shaft carrier has a supporting shaft that is inserted into an upper end of the piledriven profile.

14. The device according to claim 5, wherein a one of the tracking units comprises more than two supporting frameworks for solar panel assemblies, and wherein the mounting plates are on main support shafts of adjacent solar panel assemblies, and are connected to one another in a rotationally-fixed manner via a rigid mounting frame, and are not connected to the drive unit.

15. The device according to claim 5, wherein the drive unit is a double linear drive having opposing telescopic arms that are fastened on a shaft of the piledriven profile and engage, via two U-shaped drive brackets, the mounting plates of the rotating shafts of two adjacent main support receptacles, and wherein the two telescopic arms are driven equally in opposite directions by a drive motor.

16. A device comprising:

multiple successively arranged tracking units for solar panels each having respective drive units for solar position tracking, wherein each tracking unit has a supporting framework for two adjacent solar panel assemblies each having multiple solar panels, wherein each solar panel assembly has an associated main support shaft, wherein each main support shaft has two ends, and is connected at each end to a respective main support receptacle, wherein the main support shafts and main support receptacles arranged in series form an axis of rotation of the tracking unit, wherein the drive unit of each tracking unit is coupled to two of the main support receptacles directly adjacent thereto such that said drive unit communicates with the main support shafts connected with the main support receptacles adjacent thereto, and causes the tracking of both solar panel assemblies from east to west by extending or retracting a telescopic arm, wherein said adjacent main support receptacles are supported on a shared piledriven profile, and the drive unit is connected to the piledriven profile and to the two main support receptacles, wherein two of the main support receptacles that are adjacent each other are provided with bolts that are mounted with play in recesses of opposing side walls of a bearing shaft carrier connected to another piledriven profile such that each of the main support receptacles can be moved into inclination to the axis of rotation of the other of the main support receptacles, wherein at least one of the main support receptacles has a rotating shaft, a bolt plate with the bolts at one end of the rotating shaft, a mounting part that is a mounting plate, rotating shaft bearing profiles, a counter plate, and fastening bolts, wherein the main support shaft is located between the mounting plate and the counter plate and is fixed in a clamping manner via the fastening bolts between the mounting plate and the counter plate, wherein the rotating shaft rests at the end on a bolt plate provided with the bolts and is mounted therein such that said rotating shaft is not linearly displaceable, but is rotatable, and wherein the bearing shaft carrier has a U-profile for accommodating the bolt plate, said U-profile having legs formed by opposing side walls, said side walls having U-shaped recesses opposite one another, and wherein the bolt plate is located upright within the U-profile such that the bolts protrude through the U-shaped recesses, and wherein an attached comb plate holds the bolts in the U-shaped recesses.

17. The device according to claim 1, wherein the drive bracket consists of at least five sections.

18. A device comprising:

multiple successively arranged tracking units for solar panels each having respective drive units for solar position tracking, wherein each tracking unit has a supporting framework for two adjacent solar panel assemblies each having multiple solar panels, wherein each solar panel assembly has an associated main support shaft, wherein each main support shaft has two ends, and is connected at each end to a respective main support receptacle, wherein the main support shafts and main support receptacles arranged in series form an axis of rotation of the tracking unit, wherein the drive unit of each tracking unit is coupled to two of the main support receptacles directly adjacent thereto such that said drive unit communicates with the main support shafts connected with the main support receptacles adjacent thereto, and causes the tracking of both solar panel assemblies from east to west by extending or retracting a telescopic arm, wherein said adjacent main support receptacles are supported on a shared piledriven profile, and the drive unit is connected to the piledriven profile and to the two main support receptacles, wherein two of the main support receptacles that are adjacent each other are provided with bolts that are mounted with play in recesses of opposing side walls of a bearing shaft carrier connected to another piledriven profile such that each of the main support receptacles can be moved into inclination to the axis of rotation of the other of the main support receptacles, wherein at least one of the main support receptacles has a rotating shaft, a bolt plate with the bolts at one end of the rotating shaft, a mounting part that is a mounting plate, rotating shaft bearing profiles, a counter plate, and fastening bolts, wherein the main support shaft is located between the mounting plate and the counter plate and is fixed in a clamping manner via the fastening bolts between the mounting plate and the counter plate, wherein at least two of the main support receptacles have a respective mounting plate, and wherein the drive unit is a linear drive, and is fastened on a shaft of the piledriven profile and engages via a U-shaped drive bracket on the mounting plates of the rotating shafts of two adjacent main support receptacles, and wherein a mounting plate of the linear drive has brackets that enclose a shaft of the piledriven profile, and jaws on a second side opposite the first side, and between the jaws a lower eye of the linear drive is mounted.

19. The device according to claim 1, wherein the bearing shaft carrier has a supporting shaft that is inserted into an upper end of the piledriven profile.

20. The device according to claim 2, wherein the bearing shaft carrier has a supporting shaft that is inserted into an upper end of the piledriven profile.

21. The device according to claim 18, wherein the bearing shaft carrier has a supporting shaft that is inserted into an upper end of the piledriven profile.

* * * * *